United States Patent [19]

Imabayashi et al.

[11] Patent Number: 5,573,888
[45] Date of Patent: Nov. 12, 1996

[54] IMAGE TRANSFER METHOD

[75] Inventors: Arata Imabayashi; Yasuhiro Tanaka, both of Tokyo, Japan

[73] Assignee: Toyo Ink Manufacturing Co., Ltd., Tokyo, Japan

[21] Appl. No.: 155,198

[22] Filed: Nov. 22, 1993

[30] Foreign Application Priority Data

Mar. 18, 1993 [JP] Japan ................................... 5-058883

[51] Int. Cl.⁶ .................................................... G03C 11/12
[52] U.S. Cl. ...................... 430/256; 430/257; 430/273.1
[58] Field of Search .................................... 430/257, 253, 430/273, 256

[56] References Cited

U.S. PATENT DOCUMENTS

| | | | |
|---|---|---|---|
| 4,489,154 | 12/1984 | Taylor, Jr. | 430/257 |
| 4,987,051 | 1/1991 | Taylor, Jr. | 430/257 |
| 5,049,476 | 9/1991 | Platzer | 430/257 |
| 5,055,375 | 10/1991 | Matsuo et al. | 430/253 |
| 5,155,010 | 10/1992 | Sandner | 430/253 |
| 5,224,423 | 7/1993 | Borel | 101/415.1 |
| 5,236,806 | 8/1993 | Platzer | 430/253 |

FOREIGN PATENT DOCUMENTS

| | | |
|---|---|---|
| 0350195 | 1/1990 | European Pat. Off. . |
| 0455068 | 11/1991 | European Pat. Off. . |

OTHER PUBLICATIONS

Konica Corp., Patent Abstracts of Japan, vol. 12, No. 413 (P-780) 2 Nov. 1988 JP-A-63 149 651.

*Primary Examiner*—John S. Y. Chu
*Attorney, Agent, or Firm*—Wenderoth, Lind & Ponack

[57] ABSTRACT

An image transfer method which can prevent poor registering and gives an esthetically fine multi-color prepress proof and a multi-color print with excellent registering, the method comprising imagewise exposing an image-forming material consisting essentially of a substrate, a photosensitive layer formed on the substrate and a protection film attached to the photosensitive layer, peeling off the protection film, and introducing the image-forming material into a nip formed so that the photosensitive layer of the image-forming material and an image receptor come into contact with each other to selectively transfer part of the photosensitive layer to the image receptor and obtain a transfer image, the method using the image forming material prepared by attaching the protection film to the photosensitive layer under a tension at right angles with the axial direction of the rolls.

5 Claims, 1 Drawing Sheet

IMAGE TRANSFER METHOD

FIELD OF THE INVENTION

The present invention relates to an image transfer method. More specifically, it relates to an image transfer method using an image-forming material consisting essentially of a substrate, a coloring photosensitive layer and a protection film, which permits excellent registering and therefore gives an aesthetically fine multi-color prepress proof or print.

PRIOR ART OF THE INVENTION

Single-color and multi-color prepress proof sheets suitable for proof printing have been recently increasingly produced by imagewise exposing photosensitive layer(s) of image-forming material(s) to form image(s) and transferring the image(s) to an image receptor under heat, generally around 100° C. The image-forming material is generally formed of a substrate, a photosensitive layer (formed on one surface of the substrate) and a protection film. The substrate and the protection film are selected from thin films or sheets formed from a material such as cellulose acetate, polystyrene, polyvinyl chloride or polyethylene terephthalate. The image receptor is selected from paper and a film. The photosensitive layer contains a dye and/or a pigment and a photopolymerizable compound.

For producing the above prepress proof sheet, there has been proposed an image transfer method in which a platen to which an image-forming material is attached and a transfer cylinder to which an image receptor is attached are rotated so that the photosensitive layer of the image-forming material and the image receptor are brought into contact with each other under pressure, whereby an image formed in the photosensitive layer by imagewise exposing is transferred to the image receptor in a nip portion formed by the platen and the transfer cylinder. A multi-color print or prepress proof sheet is produced by color-scanning an original of a multi-color image, imagewise exposing image-forming materials corresponding to separated colors, e.g., yellow, magenta, cyan and black, to form images of these colors in the image forming materials (one image of one color in one image-forming material), and consecutively transferring these formed images to one image receptor.

For attaching the image-forming material to the platen, a pin bar is generally used to facilitate the registering of each color. The pin bar has a structure in which a plurality of pins are provided on a plate extending in the axial direction of the platen. However, the registering accuracy with the pin bar has not yet been fully satisfactory.

SUMMARY OF THE INVENTION

It is an object of the present invention to provide an image transfer method which can give a multi-color prepress proof and a multi-color print with excellent registering.

It is another object of the present invention to provide an image transfer method using an image-forming material which can give a multi-color prepress proof and a multi-color print with excellent registering.

According to the present invention, there is provided an image transfer method comprising imagewise exposing an image-forming material consisting essentially of a substrate, a photosensitive layer formed on the substrate and a protection film attached to the photosensitive layer, peeling off the protection film, and introducing the image-forming material into a nip formed so that the photosensitive layer of the image-forming material and an image receptor come into contact with each other to selectively transfer part of the photosensitive layer to the image receptor and obtain a transfer image, the method using the image forming material prepared by attaching the protection film to the photosensitive layer under a tension at right angles to the axial direction of the rolls.

DETAILED DESCRIPTION OF THE INVENTION

Figure 1:
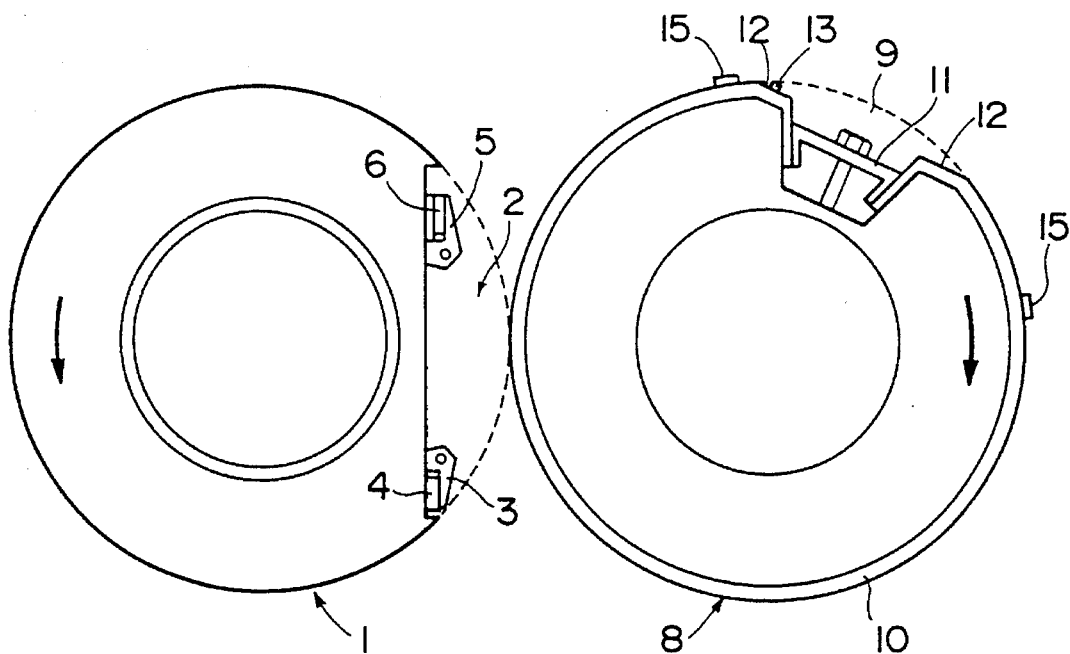
FIG. 1 is a schematic view of an image transfer apparatus suitable for the image transfer method of the present invention.

The present invention will be detailed hereinafter with reference to the drawings, FIG. 1 is a schematic view of an image transfer apparatus suitable for the image transfer method of the present invention, The constitution of a transfer cylinder 1 will be explained below with reference to FIG. 1, The transfer cylinder 1 has a partial cut-off portion 2 formed on part of its surface. The partial cut-off portion has a clamp (top end clamp) consisting of a holder 3 for holding the top end side of an image receptor (not shown) such as paper and a holder seat 4 and a clamp (bottom end clamp) consisting of a holder 5 for holding the bottom end of the image receptor and a holder seat 6. The image receptor is attached to the transfer cylinder by allowing the top end clamp to hold the top end side of the image receptor, turning the transfer cylinder in the direction of the arrow while the image receptor is tensioned, and allowing the bottom end clamp to hold the bottom end side of the image receptor.

The constitution of a platen 8 will be explained below with reference to FIG. 1. The platen 8 has a partial cut-off portion 9. The surface of the platen 8 is wrapped with a blanket 10, and the top and bottom end sides of the blanket 10 are fixed within the partial cut-off portion with a blanket fixing means 11. The partial cut-off portion 9 has two slope portions 12 extending to a platen surface (circumferential surface), and one slope portion is provided with a pin bar 13. The pin bar 13 is pressed on a platen surface with the blanket 10 which has holes in places corresponding to pin positions of the pin bar 13. The pin bar 13 has so small a height that its top does not protrude over the circumferential surface of the platen 8. That is so that the pin bar 13 and the surface of the transfer cylinder 1 are not damaged in the rotation of the platen 8 and the transfer cylinder 1. An adhesive tape 15 is provided on a platen surface near the slope portion where the pin bar 13 is located, and another adhesive tape 15 is also provided on a platen surface near the other slope portion. An image-forming material (not shown) formed of a substrate, a photosensitive layer containing a dye and/or a pigment and a photopolymerizable compound and a protection film has holes corresponding to pins of the pin bar 13, and the holes are located in the top end side of the image-forming material. The image-forming material is attached as follows. The holes of the image-forming material are fitted to the pins of the pin bar 13. Then, the platen 8 is turned in the direction of the arrow, and the top side of the image-forming material is fixed with the adhesive tape 15, followed by fixing the bottom side of the image-forming material with the other adhesive tape 15.

After the image-forming material is attached to the platen, the protection film is peeled off. Then, the transfer cylinder 1 and the platen 8 are rotated synchronously to introduce the image-forming material and the image receptor into the nip formed by the transfer cylinder and the platen so that the photosensitive layer and the image receptor come into contact with each other, whereby part of the photosensitive layer is selectively transferred to the image receptor to form a transfer image.

The image-forming material used in the image transfer method of the present invention has characteristic features in that the tension applied to the photosensitive layer and the tension applied to the protection film are well-balanced when the protection film is attached to the photosensitive layer in the step of preparing the image-forming material, so that the image-forming material can be attached onto the platen in a state in which the substrate is free of crinkling and slacken thereby yielding excellent registering accuracy.

In the present invention, the elastic strain percentage refers to a ratio of the total length of an elongated protection layer or substrate to its original length, i.e., the elastic strain Percentage=(the total length of an elongated protection film or substrate–the original length)/the original length.

Figure 2:
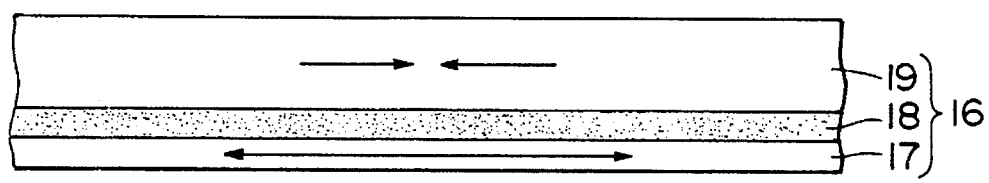
FIG. 2 is a schematic view of the interior of an image-forming material showing a state of an internal stress when the elastic strain percentage of the substrate is greater than the elastic strain percentage of the protection film.

FIG. 2 schematically shows the function of the image-forming material used in the present invention in which numeral 16 indicates an image-forming material. The image-forming material 16 consists essentially of a substrate 17, a photosensitive layer 18 formed on the substrate 17 and a protection film 19 attached to the photosensitive layer 18. The protection film generally has a thickness of 40 to 200 µm. The substrate generally has a thickness of 5 to 30 µm. The thickness of the protection film is generally 5 to 25 times as large as the thickness of the substrate. In FIG. 2, arrows show states of internal stresses when the protection film is attached to the photosensitive layer in a state in which the elastic strain percentage of the substrate under tension is greater than the elastic strain percentage of the protection film under tension.

The ratio of the elastic strain percentage (B) of the substrate to the elastic strain percentage (A) of the protection film (B/A) is generally 2 to 20, preferably 5 to 18, more preferably 7 to 15. In the image-forming material 16, the protection film 19 has a larger thickness than the substrate 17, and after being attached to the photosensitive layer 18, the protection film 19 nearly restores its original length. On the other hand, the substrate 17 adheres to the protection film 19 with the photosensitive layer between them in a state in which the substrate 17 has a greater elastic strain percentage than the protection film 19. After the protection film nearly restores its original length, the substrate 17 is in a state in which its shrinkage is prevented by the protection film 19 and is under tension. This state is indicated by the arrows in FIG. 2.

The image-forming material in the above state is attached to the platen, and then the protection film is peeled off from the image-forming material, whereby the substrate which has been released from the constraint by the protection film shrinks by a restoring force to thus be tightly attached to the platen surface. When the direction in which the tension is applied to the image-forming material is at right angles to the axial direction of the rolls (transfer cylinder and platen), the attaching property of the image-forming material improves. When the above direction is parallel with the axial direction of the rolls, the attaching property does not improve.

When the ratio of the elastic strain percentage (B) of the substrate to the elastic strain percentage (A) of the protection film (B/A) exceeds 20, the image-forming material is liable to curl due to a residual stress difference between the front and reverse surfaces thereof, and the workability with the image-forming material decreases. Further, the image-forming material is in a state in which a shearing force is on the photosensitive layer, and the photosensitive layer therefore degrades while the image-forming material is stored.

The ratio of the elastic strain percentage (B) of the substrate to the elastic strain percentage (A) of the protection film (B/A) varies across the image-forming material (in the width direction), and the variation of the above ratio (B/A) is preferably ±20% of an average strain percentage of the entire image-forming material. When the variation of the above ratio (B/A) exceeds ±20%, the restoring force greatly varies across the image-forming material, which variation causes a decrease in the attaching property of the substrate to the platen surface.

When the ratio of the elastic strain percentage (B) of the substrate to the elastic strain percentage (A) of the protection film (B/A) is less than 2, the constraining force of the protection film does not sufficiently work on the substrate. As a result, when the protection film is peeled off after the image-forming material is attached to the platen, the substrate is liable to slacken on the platen surface. The slackening of the substrate naturally causes poor registering.

Figure 3:
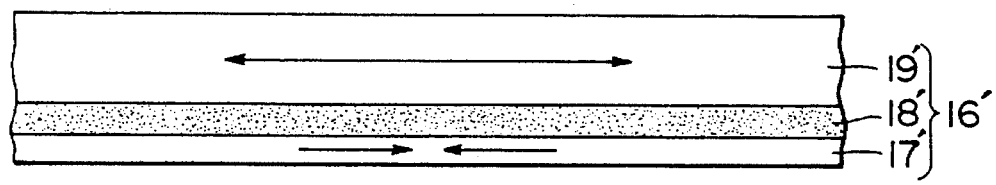
FIG. 3 is a schematic view of the interior of an image-forming material showing a state of an internal stress when the elastic strain percentage of the substrate is smaller than the elastic strain percentage of the protection film.

FIG. 3 is a schematic view of the interior of an image-forming material showing a state of an internal stress when the elastic strain percentage of the substrate is smaller than the elastic strain percentage of the protection film. Arrows in FIG. 3 indicate the directions of actions of stresses within the image-forming material, in which a compression stress is exerted on the substrate. When the image-forming material shown in FIG. 3 is attached to the platen and then the protection film is peeled off, the restoring force of the substrate which has been released from the constraining force of the protection film works in the direction in which the substrate is elongated. As a result, the attaching property of the substrate to the platen surface deteriorates, which causes a crinkling and slackening of the image-forming material and finally causes poor registering.

According to the present invention, there is provided an image transfer method which can prevent poor registering and gives an esthetically fine multi-color prepress proof and a multi-color print with excellent registering.

What is claimed is:

1. An image transfer method which comprises imagewise exposing an image-forming material consisting essentially of a substrate, a photosensitive layer formed on the substrate and a protection film attached to the photosensitive layer, peeling off the protection film, and subsequently bringing the image-forming material into contact with an image receptor so that the photosensitive layer of the image-forming material and the image receptor come into contact with each other to selectively transfer part of the photosensitive layer to the image receptor to thus obtain a transfer image, the said method employing an image forming material which is prepared by attaching the protection film to the photosensitive layer under tension at right angles to the axial direction of a platen to which the image-forming material is attached, and the substrate of the image-forming material on which the photosensitive layer is formed having a greater elastic strain percentage than the protection film.

2. A method according to claim 1, wherein the method uses an image-forming material in which the substrate on which the photosensitive layer is formed has a 2 to 20 times greater elastic strain percentage than the protection film.

3. A method according to claim 1, wherein the method uses an image-forming material in which the substrate on which the photosensitive layer is formed has a 5 to 18 times greater elastic strain percentage than the protection film.

4. A method according to claim 1, wherein the method uses an image-forming material in which an elastic strain percentage of the substrate to an elastic strain percentage of the protection film varies by ±20% or less across the image-forming material.

5. An image transfer method according to claim 1 wherein the photosensitive layer is a layer containing a dye, a pigment or a mixture thereof and a photopolymerizable compound and the imagewise exposure is with radiation which can optically cure the photopolymerizable compound.

* * * * *